United States Patent
Rao (10) Patent No.: US 8,359,432 B2
(45) Date of Patent: Jan. 22, 2013

(54) SYSTEM AND METHOD FOR TRANSFERRING DATA BETWEEN REMOVABLE STORAGE MEDIA UNITS

(76) Inventor: Bindu Rama Rao, Laguna Niguel, CA (US)

( * ) Notice: Subject to any disclaimer, the term of this patent is extended or adjusted under 35 U.S.C. 154(b) by 0 days.

(21) Appl. No.: 10/944,081

(22) Filed: Sep. 17, 2004

(65) Prior Publication Data

US 2005/0060492 A1 Mar. 17, 2005

Related U.S. Application Data

(60) Provisional application No. 60/503,924, filed on Sep. 17, 2003.

(51) Int. Cl.
*G06F 12/00* (2006.01)
*G06F 13/00* (2006.01)
*G06F 13/28* (2006.01)

(52) U.S. Cl. ....................................................... 711/115
(58) Field of Classification Search ................... 711/115
See application file for complete search history.

(56) References Cited

U.S. PATENT DOCUMENTS

| | | | | |
|---|---|---|---|---|
| 6,353,870 B1* | 3/2002 | Mills et al. | | 710/301 |
| 7,627,343 B2* | 12/2009 | Fadell et al. | | 455/557 |
| 2002/0163780 A1* | 11/2002 | Christopher | | 361/686 |
| 2003/0182569 A1* | 9/2003 | Matsuzaki et al. | | 713/193 |
| 2003/0216954 A1* | 11/2003 | Buzzelli | | 705/10 |
| 2004/0148450 A1* | 7/2004 | Chen et al. | | 710/313 |
| 2004/0180694 A1* | 9/2004 | Lai et al. | | 455/558 |
| 2004/0268040 A1* | 12/2004 | Bum et al. | | 711/115 |
| 2006/0028803 A1* | 2/2006 | Pocrass | | 361/737 |

OTHER PUBLICATIONS

Delkin Press Release, Delkin'S USB Bridge Connects a Digital Camera Directly to a Storage Device Without a Computer, May 10, 2004, Retrieved from http://www.delkin.com/news/press_release.php?id=35 on Dec. 2, 2008, 2 pages.*

* cited by examiner

*Primary Examiner* — Matthew Bradley
*Assistant Examiner* — Gary W Cygiel
(74) *Attorney, Agent, or Firm* — McAndrews, Held & Malloy, Ltd.

(57) ABSTRACT

Disclosed herein is a removable storage media unit that facilitates the easy and quick transfer of data from one unit into another. By addressing the need to transfer data between two instances of removable storage media units, such as flash based removable memory, (and between removable mobile storage devices in general) without the use of a PC or PDA, the present invention makes it possible to disseminate or share data more easily and efficiently.

20 Claims, 3 Drawing Sheets

SYSTEM AND METHOD FOR TRANSFERRING DATA BETWEEN REMOVABLE STORAGE MEDIA UNITS

CROSS-REFERENCE TO RELATED APPLICATIONS

The present application makes reference to, claims priority to, and the benefit of U.S. Provisional Patent Application 60/503,924 entitled "SYSTEM AND METHOD FOR TRANSFERRING DATA BETWEEN REMOVABLE STORAGE MEDIA UNITS", filed Sep. 17, 2003, the complete subject matter of which is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

Electronic devices, such as mobile phones and personal digital assistants (PDA's), often use memory sticks, memory cards or other forms of removable media. To transfer data contained in two instances of such removable media, it is often necessary to plug one into a personal computer or notebook computer, copy its content over, plug the second one into the personal computer or notebook computer, and finally transfer the copied contents from the personal computer or notebook computer over to the second instance of the removable media.

An electronic device often has customer specific data and content. In addition, client software often have associated data and configuration information. If the electronic device is lost, the customer specific data and content, data and configuration information associated with the client software, etc. are lost forever even though a new electronic device, similar to the old one, can be purchased. Backing up such data, configuration, etc., onto a personal computer (PC) is one option. Backing up such data in another storage device requires the use of a PC or similar device to transfer the information. Thus, backup of data from one storage media to another requires the availability or purchase of a PC.

People are always backing up data or transferring it to others, often with the use of a PC that plays the role of an intermediary device that can transfer data from one removable storage device to another. For example, floppy drives in PC are often used to copy data from one floppy to another.

From digital cameras and MP3 players to PDAs and USB flash drives, removable media such as flash memory technology (NOR, NAND) continues to permeate its way into more and more consumer electronic devices. The next big high-volume market poised to lead removable flash card sales in the near future is the cell phone market. An emerging feature these next generation multimedia phones will have is a memory expansion slot, and, as a result of strict design parameters flash vendors have introduced, a new generation of mobile flash storage formats. These formats include Memory Stick Duo, miniSD and Reduced-Sized MultiMediaCard (RS-MMC). Mobile media is becoming a necessity and people are buying them to store data. However, the same problems of requiring a PC to transfer data from one floppy to another also plagues the USB based flash drives (and also other removable media).

In response to the many different functions of handsets, the design of a memory expansion slot in the handset itself has emerged. These new phones that can accommodate memory cards give additional capacity to the phone making it possible to back-up files as well as transfer documents, pictures and music between the handset and a PC. And now, since removable flash memory cards are featured in smaller and smaller devices, a new generation of reduced-sized removable flash memory formats has emerged. These new flash cards offer significant savings in card area and in the area required to support the memory card in the host device, two critical design parameters for ultra-portable devices, such as handsets.

The first entry into this market was Sony's long awaited Memory Stick Duo. About half the size of a regular Memory Stick, the new Memory Stick Duo measures approximately 0.79 inches×1.22 inches×0.06 inches (20 mm×31 mm×1.6 mm) and weighs 0.07 ounces. This compares to the 2.0×0.85×0.11 inches and the 0.14 ounces that a regular Memory Stick packs. The size of the new Memory Stick Duo makes it just about equivalent to that of a Secure Digital card (or MultiMediaCard).

The Memory Stick Duo isn't a replacement for the original Memory Stick, which accounts for nearly a quarter of all flash memory card sales in the United States. Rather, the new Memory Stick Duo is an extension of the Memory Stick, enabling Sony to further reduce the size of its devices. Sony has also made available a full size adapter for the Duo that allows the card to fit in existing Memory Stick slots.

Another recent entry into the mobile removable flash memory card market is SanDisk's miniSD. MiniSD cards are targeted at the cell phone market, and in particular, the newest generation of 2.5G and 3G phones that are featuring camera functionality. The new format was developed by Toshiba, Matsushita and SanDisk, the three original developers of the SD card. The miniSD format was recently adopted by the SD Association as an ultra-small form factor extension to the SD card standard. Another key benefit of the miniSD card is its compatibility with the existing SD format. Since it's an extension of the SD card standard, it uses the same interface.

In November of 2002, the members of the MultiMediaCard Association finally approved a new reduced-sized standard for the MultiMediaCard, called, the Reduced-Size MultiMediaCard (RS-MMC). Like the Memory Stick Duo and miniSD card, the new RS-MMC is clearly designed for the mobile phone and PDA markets. The format can also serve as a platform for digital camera manufacturers to build even smaller cameras. The new storage form factor is about the same width as an existing MMCard, but measures almost one-half the size in length, reducing the total volume by more than 40 percent.

There's clearly an evident trend among removable flash card vendors toward smaller flash memory cards. However, it is not possible to transfer information from one removable flash card into another without the help of a computer, PC, or digital processing unit, even when the vendor is the same and even when the units are themselves similar in technology and capabilities.

KanguruGuard is a built in encryption and compression program which now comes standard on all KanguruMicro Drive2.0 models. Once activated, it creates two unique folders within your KanguruMicro Drive2.0. One folder, called "Secret", automatically encrypts and compresses any data which is dragged and dropped into it. This is extremely useful when dealing with secure or confidential data. Access to this folder can only be established through use of a secure password of your choosing. The second folder, called "Zip", compresses any data which is dragged and dropped into it. This effectively increases your KanguruMicro Drives storage capacity, allowing you to store 2-3 times the amount normally possible. However, there is no easy mechanism to transfer data across two units (similar or dissimilar ones) of KanguruMicro Drive2.0 models, without the use of a computer or PC or some such digital processing device. Also, if a PC were used to transfer contents from one KanguruMicro drive into another, a user has to retrieve them from one unit into another, or drag and drop contents from one unit into another. There is no automatic mechanism by which such transfers occur.

Further limitations and disadvantages of conventional and traditional approaches will become apparent to one of ordinary skill in the art through comparison of such systems with the present invention as set forth in the remainder of the present application with reference to the drawings.

SUMMARY OF THE INVENTION

Aspects of the present invention may be found in a system for communicating data between a first removable storage media and a second removable storage media. The first removable storage media comprising an adapter. The second removable storage media comprises a complementary adapter. The first removable storage media is capable of being physically and communicatively coupled to the second removable storage media by means of the adapter and the complementary adapter. In addition, at least one of the first removable storage media or the second removable storage media also comprises a battery power source and provides the other removable media with electrical power when the first removable storage media is physically and communicatively coupled to the second removable storage media.

In an embodiment according to the present invention, at least a portion of the contents of the first removable storage media is communicated to the second removable storage media when the first removable storage media is physically and communicatively coupled to the second removable storage media.

In an embodiment according to the present invention, the contents of a special location or folder in the first removable storage media located is communicated to the second removable storage media, where it replaces the contents of a second special location or folder, when the first removable storage media is physically and communicatively coupled to the second removable storage media.

Aspects of the present invention may be found in a data transfer system for transferring at least a portion of the contents of the first removable storage media to a second removable storage media. The data transfer system comprises a first adapter for physically and communicatively coupling the first removable storage media and a second adapter for physically and communicatively coupling the second removable storage media. It also comprises a battery power source that provides battery power to either or both of the first removable storage media or the second removable storage media via their respective adapters.

In one embodiment of the present invention, the data transfer system of also comprises a transfer button for transferring data between the first removable storage media and the second removable storage media. When the transfer button is activated, at least a portion of the contents of the first removable storage media is communicated to the second removable storage media.

Aspects of the present invention may be found in a system for communicating at least a portion of the contents of a first removable storage media into a second removable storage media. The system comprises the first removable storage media that is capable of being physically and communicatively coupled to the second removable storage media by means of a mutually compatible adapter on the first removable storage media and the second removable storage media. The first removable storage media also comprises a battery power source for electrical power. The first removable storage media provides electrical power from the battery power source to the second removable storage media and communicates a content to the second removable storage media when it is physically coupled to the second removable storage media.

These and other advantages, aspects, and novel features of the present invention, as well as details of illustrated embodiments, thereof, will be more fully understood from the following description and drawings.

DETAILED DESCRIPTION OF THE INVENTION

Electronic devices may be adapted to use removable storage media such as USB based flash memory sticks. To retrieve or transfer information from one such unit of removable storage media into another, without the use of a PC or computer, aspects of the present invention make it possible to plug them together and automatically transfer data between them. Transferred information, according to the present invention, may comprise of encrypted information that is first decrypted by the source unit, transferred and stored again in an encrypted form by the recipient unit.

A removable storage media may, for example, be one that is pluggable into any mobile electronic device, such as, mobile cellular phone handsets, personal digital assistants (PDA's), pagers, MP3 players, digital cameras, etc. When plugged into the mobile electronic device, the removable storage media charges the battery contained in or associated with the removable storage media, such battery typically being physically contained in the casing of the removable storage media.

According to the present invention, the removable storage media comprises both a male adapter and a female adapter, and may comprise of a battery unit too. For example, in one embodiment, a USB based removable storage media comprises both a male and a female adapter, the male adapter typically used to plug into mobile electronic devices or PCs, the female adapter used to plug into other removable storage media to transfer data without the use of a computer to mediate or facilitate data transfer.

Aspects of the present invention may be found in removable mobile storage devices, such as flash based memory that employ various mobile flash storage formats. These formats include Memory Stick Duo, miniSD and Reduced-Sized MultiMediaCard (RS-MMC). Such mobile media is becoming a necessity and people are buying them to store data. The present invention solves the problems of requiring a PC to transfer data from one instance of a flash memory storage to another. By addressing the need to transfer data between two instances of flash based removable memory (and between removable mobile storage devices in general) without the use of a PC or PDA, the present invention makes it possible to disseminate or share data more easily and efficiently, and often automatically, without the use of additional user interaction.

In one embodiment, the removable storage media takes the form of a USB based flash memory device that is used to store information, such as from a computer or PC. In one related embodiment, it comprises a NAND flash memory. In another it comprises NOR flash memory. Other technologies of flash memory, or a combination of such flash technologies, may also be employed.

In one embodiment, a USB based flash drive (or also other removable media) can be plugged into another USB based flash drive in order to transfer data from one to the other. In a related embodiment, they exchange specific subsets of data stored in them. In another embodiment, entire content from one removable flash drive, such as a USB based removable flash drive, is transferred and copied to the other similar unit into which it has been plugged. In yet another embodiment, a subset of the contents from one removable flash device is appended onto the existing contents of another into which it has been plugged in. Such a subset of contents can be specific folders designated to be used for transfer of data between two such flash memory devices when they are communicatively coupled.

Although some embodiments have been described that employ USB ports/adapters, it will be apparent to one of skill in the art upon reading this disclosure that other types of adapters employed for communication in flash based removable storage devices may be employed for transfer of data between two instances of flash based removable storage devices.

In one embodiment, a USB based flash drive (or also other removable media) can be plugged into another USB based flash drive in order to transfer data from one to the other. In a related embodiment, they exchange specific subsets of data stored in them. In another embodiment, entire content from one removable flash drive, such as a USB based removable flash drive, is transferred and copied to the other similar unit into which it has been plugged. In yet another embodiment, a subset of the contents from one removable flash device is appended onto the existing contents of another into which it has been plugged in. Such a subset of contents can be specific folders designated to be used for transfer of data between two such flash memory devices when they are communicatively coupled.

Although some embodiments have been described that employ USB ports/adapters, it will be apparent to one of skill in the art upon reading this disclosure that other types of adapters employed for communication in flash based removable storage devices may be employed for transfer of data between two instances of flash based removable storage devices.

Figure 1:
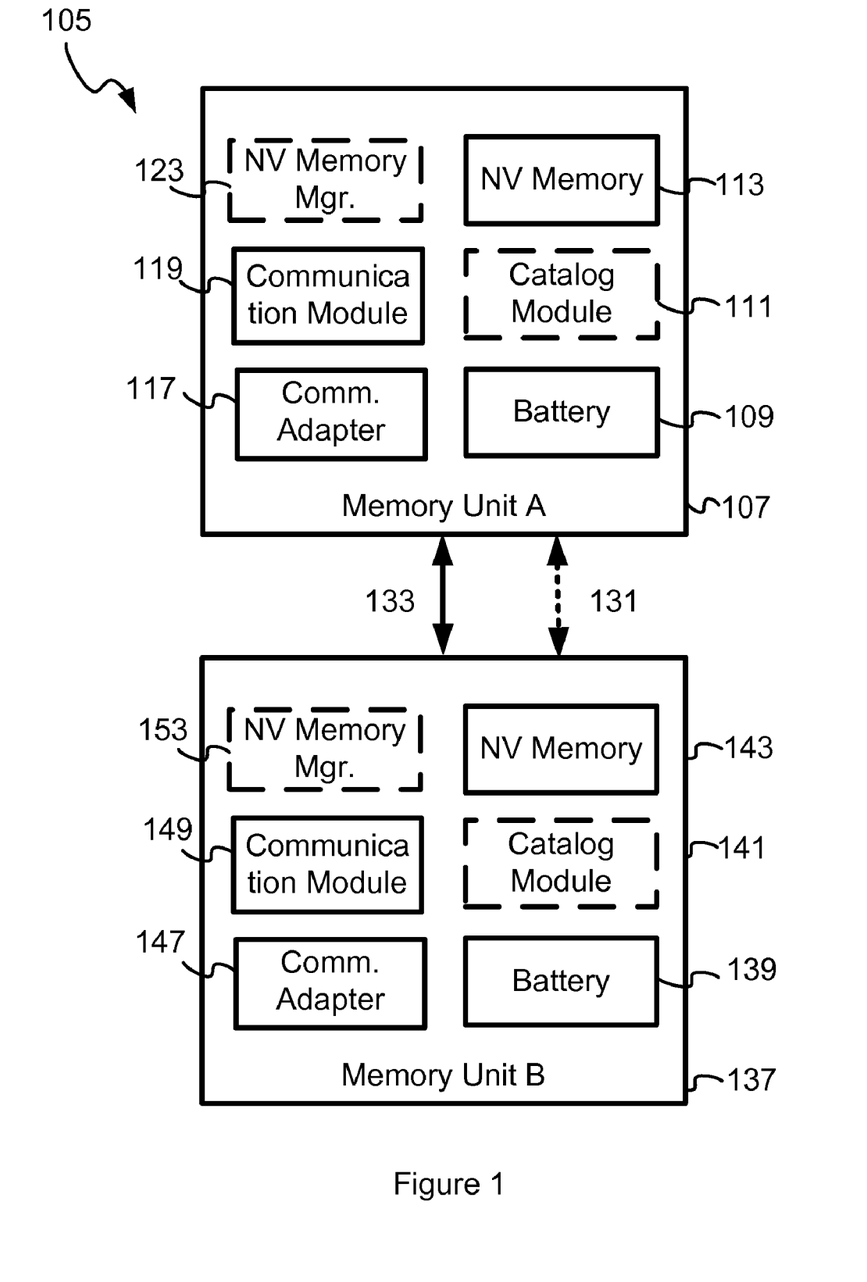
FIG. 1 is a perspective block diagram of a system for transferring data between removable storage media units, employing a communication link, and optionally, a power transfer means.

FIG. 1 is a perspective block diagram of a system 105 for transferring data between removable storage media units 107, 139 employing a communication link 131, and optionally, a power transfer means 133. The memory unit A 107 and the memory unit B 137 each comprise of a battery 109, 139, an optional catalog module 111, 141, a non-volatile memory 113, 143, a communication adapter 117, 147, a communication module 119, 149 and an optional non-volatile memory manager 123, 153, respectively.

The system 105 for transferring data 105 facilitates backup of the contents of a memory unit A 107 in the second unit (that is similar) memory unit B 137 which is in the vicinity and communicatively coupled to the memory unit A 107. Specifically, the memory unit A 107 is either plugged into the memory unit B 137 or otherwise wirelessly coupled, using appropriate communication adapters 117, 147. Again, the complete contents of the non-volatile (NV) memory 113, or a subset thereof, can be transmitted over the communication link 131 by the memory unit A 107 to the memory unit B 137 for storage in the NV memory 143. Similarly, the complete contents of the NV memory 143, or a subset thereof, can be transmitted over the communication link 131 by the memory unit B 137 to the memory unit A 107 for storage in the NV memory 113.

In one embodiment, the memory unit A 107 and the memory unit B 137 communicate using wireless means 131, such as the short range wireless communication technology known by the name Bluetooth, IEEE 802.11, or infrared (IR) communications and the communication adapters 117, 147, respectively, provide the appropriate communications facilities to support such wireless interactions, while the communication modules 119, 149, respectively, employ the appropriate protocol stacks to facilitate such communications.

The NV memory managers 123, 153 provide support for the copying, replacing or appending of data communicated from one the memory unit, such as memory unit A 107, to the other, such as the memory unit B 137.

The batteries 109, 139 provide power to the respective memory units that enables communication (such as data transfer) between the memory units.

The optional catalog modules 111, 141 make it possible to retrieve a list of available components or data units from the other unit that may be selectively displayed in the same units or in the other unit with which a memory unit is communicatively coupled. For example, the user of the memory unit A 107 may browse through a list of data items retrieved from the catalog module 111 and select one or more data items for transfer to the memory unit B, and then initiate the transfer. A small display unit, such as an LCD screen and a driver for the LCD screen, is necessary for the viewing of the catalog in the memory unit A 107. Again, a user of the memory unit B 137 may browse through a list of data items retrieved from the catalog module 111 of the memory unit A 107 and select one or more data items for transfer to the memory unit B.

In one embodiment, a first removable storage media unit comprises a male adapter and a female adapter, considered to be a complementary adapter. A second removable storage media unit also comprises only a male adapter. The first and the second removable storage media units are capable of being physically plugged in employing the male adapter of the second removable storage media unit and the female adapter of the first removable storage media unit. When these two units are physically plugged in, at least some portion of data in the first removable storage media unit is transferred from the first removable storage media unit to the second removable storage media unit.

Figure 2:
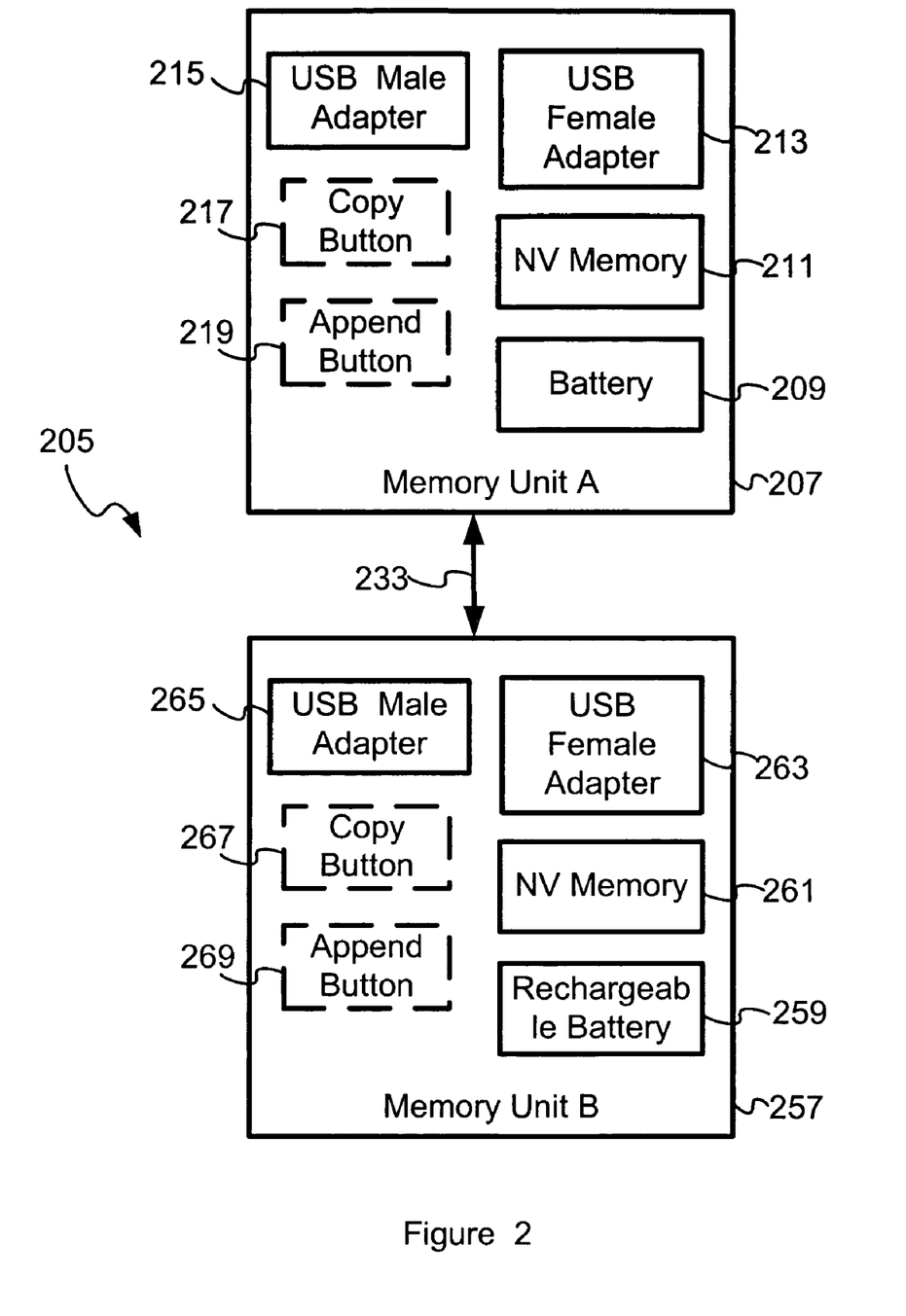
FIG. 2 is a perspective block diagram of an embodiment of the present invention wherein USB based removable flash memory storage devices comprise of both a USB male adapter as well as a USB female adapter such that two such units could be plugged into each other for transferring data from one to the other.

FIG. 2 is a perspective block diagram of an embodiment of the present invention wherein USB based removable flash memory storage devices 207, 257 comprise of both a USB male adapter as well as a USB female adapter such that two such units could be plugged into each other for transferring data from one to the other. In addition, to simplify user interaction, two buttons are optionally presented on the USB based removable flash memory storage devices 207, 257—a copy button 217, 267 and an append button 219, 269. The copy button facilitates the transfer of data from the sender unit to the receiver unit wherein the entire contents of the receiver's non-volatile memory 211, 261 (or alternatively, specific designated folders therein) is replaced by the content being transferred by the sender unit. The append button 219, 269 facilitates the appending of the data received in the non-volatile memory of the receiver unit with the data sent by the sender unit. Other type of buttons may be employed, such as for the specification of "all" or "designated folders" for the scope of data transfers.

The system 205 of FIG. 2 comprises two USB based removable flash memory storage devices—memory unit A 207 and memory unit B 257, that are communicatively coupled over a link 233 that is established between the two devices using the available USB adapters, for example using a USB male adapter 215 of memory unit A 207 that is plugged into a USB female adapter 263 of the memory unit B 257. The two memory units A and B 207, 257 can also be communicatively coupled over a link 233 when the USB female adapter 213 of memory unit A 207 is plugged into a USB male adapter 265 of the memory unit B 257. All the contents of the non volatile memory 211 of the memory unit A 207 is copied, or appended, based on user selections of buttons (217, 219) into the corresponding non-volatile memory 261 of the memory unit B 257, in one embodiment. For example, the user would initiate transfers of data by plugging in the two memory units 207, 257 and activating a "copy" button 217 on the memory unit A 207.

It is not necessary for both the USB based removable flash memory storage devices 207, 257 to have battery supply units 209, 259. In fact, only one of them may have a battery while the other one could receive power from the one that has a battery supply 209, 259. In addition, if one of the battery supply units 209, 259 is rechargeable, then the other one could selectively charge it, if necessary, when the two corresponding USB based removable flash memory storage devices 207, 257 are plugged in for transfer of data.

In one embodiment, when the memory unit B 257 is plugged into a PC, PDA or other similar devices to be used as a removable flash memory storage device, its rechargeable battery 259 is charged up while the memory unit B 257 is plugged in. Later, if the memory unit B 257 is plugged into the memory unit A 207, its battery is employed for data transfer between the two removable flash memory storage devices when it is discovered that the battery 209 is not rechargeable and the battery 259 is sufficiently or adequately charged.

In one embodiment, the completion of the transfer is indicated by a visual flashing completion indicator, such as a flashing LED or a flashing of a widget on an LCD screen. Audio indicators such as a beep(s) or a tune are also contemplated. Tactile feedback, such as vibration, are also contemplated.

In one embodiment, the non-volatile memory modules of each of the removable flash memory storage devices comprise of a special folders or memory segments that are used as the target for transfers between the devices. For example, a "xfer" folder in each device is designated as a folder from which all contents are transferred to the non-volatile memory of the other device (say, into a "received" folder in the other device). The "copy" button would result in the replacement of the contents of the "received" folder in the recipient removable flash memory storage device with the contents of the "xfer" folder of the sending (or source) removable flash memory storage device. Similarly, the "append" button, when activated, would result in the appending of the contents of the "xfer" folder of the sending (or source) removable flash memory storage device to the existing "received" folder in the recipient removable flash memory storage device. In a related embodiment, the "append" button, when activated, would result in the creation of duplicate files with slightly modified names in the "received" folder in the recipient removable flash memory storage device, when the names of some of the files are the same in both the "xfer" folder in the sending removable flash memory storage device and the "received" folder in the recipient removable flash memory storage device.

In one embodiment, although the transfer of data occurs between the sending and the recipient removable flash memory storage devices, the data transferred may be stored in an encrypted mode in both the sending and the recipient removable flash memory storage devices. The encrypted data may be decrypted just before the data transfer by the sending removable flash memory storage device, and encrypted just before saving by the recipient removable flash memory storage device. For encryption and decryption, the sending and the recipient removable flash memory storage devices employ their own device specific or technology specific encryption and decryption techniques and algorithms. In a related embodiment the sending and the recipient removable flash memory storage devices employ the same encryption and decryption techniques and algorithms. In another related embodiment, the encrypted data from the send device is transferred in encrypted form received and saved in encrypted form by the recipient device, without the need to decrypt for transmission between the devices or for saving in the recipient device.

Although FIG. 2 has been described in terms of a USB adapter, the present invention is easily incorporated to address other types of adapters that may be employed in such removable flash memory storage devices 207, 257.

Figure 3:
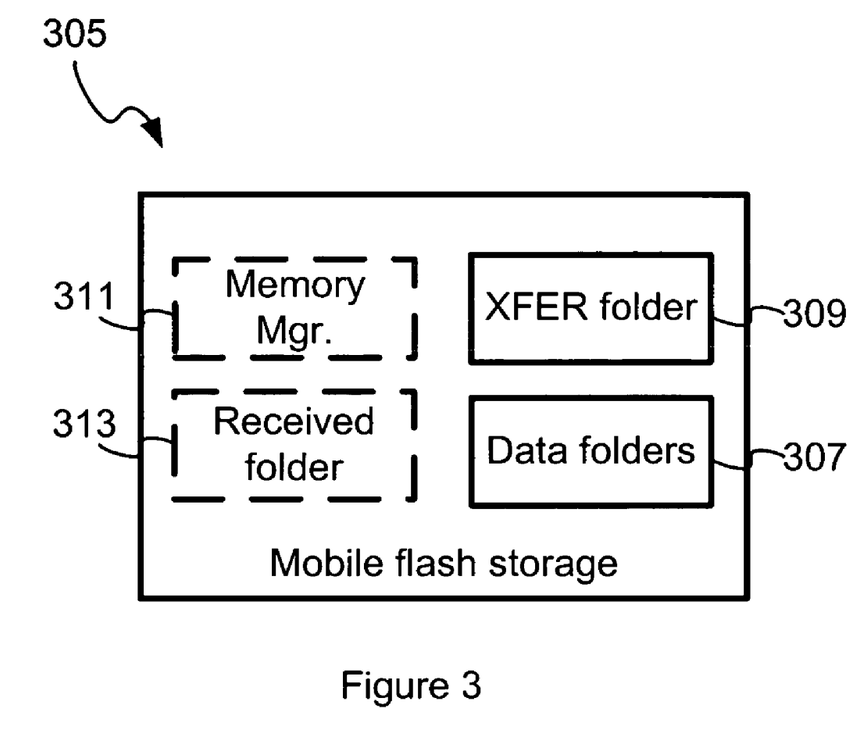
FIG. 3 is a block diagram of a non-volatile memory module that is employed in the memory unit A of the system described in FIG. 2.

FIG. 3 is a block diagram of a non-volatile memory module that is employed in the memory unit A 207 of the system 205 described in FIG. 2. The non-volatile memory module 305 comprises a XFER folder 309 from which data is transferred, data folders 307, an optional received folder 313 where received data is stored and an optional memory manager 311. The contents of the XFER folder are used during the transfer of data from one removable flash memory storage device to another, the received folder 313 being the recipient of such transferred data, if it is available. Otherwise, the received data is either copied or appended to the data folders 307, based n system settings and/or user preferences. Using a PC or some other device, a user can transfer data into the XFER folder 309, such data originating from storage (disks, CDs, memory modules, etc.) in the PC or PDA, or from the data folders 307.

The memory manager 311, if available, can be used to manage the transfer of data into the received folder 313 or the data folders 307, transfer the data out of the XFER folder 309, etc. It also facilitates the encryption of data, if necessary, the compression of data, if necessary, during the transfers. In addition, data transferred (to and fro) may be digitally signed using digital certificates (that may be available or installed in the removable flash memory storage devices). Other forms of ensuring security, authentication and integrity of data are also contemplated.

In one embodiment of the present invention, a system for transferring data between removable storage media provides a plurality of adapters into which removable media can be plugged in. It also provides for a power source, such as a battery or an electric power cord that is plugged into an electrical outlet. The system for transferring data provides for a transfer button for transferring data from one removable storage media (such as from a specific folder) to another. It also provides an append button to append data or files from one folder of one removable storage media into data or files in another folder in a different removable storage media that is also plugged in at the same time.

In one embodiment, the system for transferring data between removable storage media provides different types of adapters to enable the physical coupling of removable storage devices of different types. For example, it provides a plurality of USB adapters and other non-USB adapters, such as a serial communication adapter or a wireless communication adapter, such as an IR port or a Bluetooth port.

In one embodiment, a folder, called "Secret", wherein data is automatically encrypted and compressed when stored into the folder, makes it possible to securely and efficiently store data, such as any data which is dragged and dropped into it. In addition, when two of these memory devices are plugged into each other and a transfer is activated on one of them (say, by means of a Transfer button or Append button), the contents of the "Secret" folder are automatically transferred into the "Secret" folder of the other. This is extremely useful when dealing with secure or confidential data. Both "Copy" and "Append" operations are supported, by the activation of appropriate buttons on the memory devices. In a related embodiment, an additional second special folder, called "Zip", is employed wherein data is compressed when they are saved or transferred from another memory device. Thus, data transferred to the ZIP folder either via a drag and drop operation into the folder when plugged into a PC or via a data transfer when plugged into another similar device, is stored in a compressed format.

In a related embodiment, data stored in a compressed format is decompressed before transfer and subsequently compressed before storage into the recipient memory device. Similarly, encrypted data is unencrypted by the recipient device and re-encrypted into a different format (employing possibly a different encryption algorithm) by the recipient device when two such removable memeory devices are plugged into each other.

Accordingly, the present invention may be realized in hardware and software combination. Any kind of removable storage media or other apparatus adapted for carrying out the methods described herein is suited. A typical combination of hardware and software may be a removable storage media with a micro-control logic embedded in it. The micro-control logic manages the transfer of data between two units of the removable storage media that are plugged into each other. It manages transfer of data contained in specific folders or directories. It also manages decryption in a source device, if necessary, and encryption in a target device, if necessary and if supported.

In a different embodiment, encrypted or compressed data, when transferred from one removable storage media into another one to which it is plugged, is saved in the original encrypted or compressed format without any decryption or compression of the data during, just before, or immediately after the transfer between the two removable storage media units.

The present invention may be embedded in a mobile product, which comprises all the features enabling the implementation of the methods described herein, and which when activated in the mobile product is able to carry out these methods.

In general, a first removable storage media device has an adapter for getting plugged into a complementary adapter a second removable storage media device, at least one of the two removable storage media devices comprising a source of power, such as a battery power. In one embodiment, the adapter is a male adapter, and the complementary adapter is a female adapter. The adapter and the complementary adapter are mutually compatible adapters. The device that activates (actually the device on which a user activates) the "copy" or "append" button is designated as the sending removable storage media device while the other one is designated as the receiving removable storage media device.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system for communicating data between removable storage media devices, the system comprising:
   a first removable storage media device, the first removable storage media device comprising an adapter;
   a second removable storage media device, the second removable storage media device comprising a complementary adapter;
   the first and second removable storage media devices each configured to be plugged into a mobile electronic device, wherein the mobile electronic device comprises one of a mobile cellular phone handset, personal digital assistant (PDA), pager, MP3 player, and digital camera;
   the first removable storage media device configured to be physically and communicatively coupled to the second removable storage media device by means of the adapter and the complementary adapter;
   wherein one or both of the first removable storage media device and the second removable storage media device comprise a battery power source and providing the other removable storage media device with electrical power from the battery power source when the first removable storage media device is physically and communicatively coupled to the second removable storage media device;
   wherein one or both of the first removable storage media device and the second removable storage media device comprise a plurality of Universal Serial Bus (USB) adapters, to enable physically coupling the one or both of the first removable storage media device and the second removable storage media device;
   wherein at least a portion of the contents of the first removable storage media device is communicated to the second removable storage media device when the first removable storage media device is physically and communicatively coupled to the second removable storage media device;
   wherein the at least a portion of the contents of the first removable storage media device that is communicated to the second removable storage media device is digitally signed using a digital certificate that is available or installed in the first removable storage media device; and
   wherein the digitally signed at least a portion of the contents of the first removable storage media device that is received by the second removable storage media device from the first removable storage media device is discarded if the second removable storage media device determines, based on the digital signature, that it is not authentic or it is corrupted.

2. The system according to claim 1, wherein the contents of a special location or folder located in the first removable storage media device is communicated to the second removable storage media device and the contents of the second removable storage media device located in another special location or folder is communicated to the first removable storage media device, when the first removable storage media device is physically and communicatively coupled to the second removable storage media device.

3. The system according to claim 2, wherein the contents of a special location or folder located in the first removable storage media device is communicated to the second removable storage media device, where it is appended to the contents of a second special location or folder, when the first removable storage media device is physically and communicatively coupled to the second removable storage media device.

4. The system according to claim 2, wherein the contents of a special location or folder located in the first removable storage media device is communicated to the second removable storage media device, where it replaces the contents of a second special location or folder, when the first removable storage media device is physically and communicatively coupled to the second removable storage media device.

5. The system according to claim 1, wherein at least a portion of the contents of the first removable storage media device is communicated to the second removable storage media device and at least a portion of the contents of the second removable storage media device is communicated to the first removable storage media device when the first removable storage media device is physically and communicatively coupled to the second removable storage media device.

6. The system according to claim 1, wherein the first removable storage media device is automatically communicatively coupled to the second removable storage media device and transfers at least a portion of its content to the second removable storage media device when the first removable storage media device is physically coupled to the second removable storage media device.

7. The system according to claim 6, wherein the system facilitates selective encryption of data communicated and selective compression of data when the data is communicated between the first removable storage media device and the second removable storage media device.

8. The system according to claim 1, wherein the first removable storage media device is automatically communicatively coupled to the second removable storage media device when the first removable storage media device is physically coupled to the second removable storage media device and wherein a data transfer between the first removable storage media device and the second removable storage media device is initiated when a transfer button on either one of the first removable storage media or the second removable storage media devices is activated.

9. The system according to claim 8, wherein the first removable storage media device and the second removable storage media device each comprise a transfer folder from which data is transferred to the other and a received folder where a data received from the other is stored.

10. The system according to claim 9, wherein the data received in either of the first removable storage media device or the second removable storage media device is either copied or appended to the corresponding received folder, based on a system settings or a user preference setting in the associated removable storage media device.

11. The system according to claim 1, wherein the adapter and the complementary adapter are communicatively coupled using a communication link referred to as a universal serial bus (USB) link.

12. The system according to claim 1, wherein the adapter and the complementary adapter are communicatively coupled using a short range wireless communication link referred to by the name Bluetooth.

13. The system according to claim 1, wherein the adapter and the complementary adapter are communicatively coupled using an IEEE 802.11 compliant wireless communication link.

14. The system according to claim 1, wherein the adapter and the complementary adapter are communicatively coupled using an infrared communication link.

15. The system according to claim 1, wherein both of the first removable storage media device and the second removable storage media device comprise a removable storage device known by one of the following names: a Secure Digital (SD) card, a MiniSD card, a MultiMedia Card (MMC), a Reduced-Size MultiMediaCard (RS-MMC), a Memory Stick, and a Memory Stick Duo.

16. A system for communicating at least a portion of the contents of one removable storage media device into another removable storage media device, the system comprising:
 a first removable storage media device configured to be physically and communicatively coupled to a second removable storage media device by means of mutually compatible adapters on the first removable storage media device and the second removable storage media device, the first removable storage media device configured to be plugged into a mobile electronic device, wherein the mobile electronic device comprises one of a mobile cellular phone handset, personal digital assistant (PDA), pager, MP3 player, and digital camera;
 the first removable storage media device also comprising a battery power source for electrical power;
 the first removable storage media device providing electrical power from the battery power source to the second removable storage media device as well as communicating content to the second removable storage media device when it is physically coupled to the second removable storage media device;
 wherein one or both of the first removable storage media device and the second removable storage media device comprise a plurality of Universal Serial Bus (USB) adapters, to enable physically coupling the one or both of the first removable storage media device and the second removable storage media device;
 wherein the at least a portion of the contents of the first removable storage media device that is communicated to the second removable storage media device is digitally signed using a digital certificate that is available or installed in the first removable storage media device; and
 wherein the digitally signed at least a portion of the contents of the first removable storage media device that is received by the second removable storage media device from the first removable storage media device is discarded if the second removable storage media device determines, based on the digital signature, that it is not authentic or it is corrupted.

17. The system according to claim 16 further comprising:
 the first removable storage media device and the second removable storage media device both comprising wireless communication means; and the first removable storage media device detecting the presence of the second removable storage media device and communicating at least a portion of the contents of the first removable storage media device to the second removable storage media device.

18. The system according to claim 17, wherein the wireless communication means comprises a short range wireless communication link referred to by the name Bluetooth.

19. The system according to claim 17, wherein the wireless communication means comprises an IEEE 802.11 compliant wireless communication link.

20. The system according to claim 16, wherein one of the first removable storage media device and the second removable storage media device comprise a removable storage device known by one of the following names: a Secure Digital (SD) card, a MiniSD card, a MultiMedia Card (MMC), a Reduced-Size MultiMediaCard (RS-MMC), a Memory Stick, and a Memory Stick Duo.

* * * * *